United States Patent
McMinn (12)

(10) Patent No.: US 6,597,620 B1
(45) Date of Patent: Jul. 22, 2003

(54) STORAGE CIRCUIT WITH DATA RETENTION DURING POWER DOWN

(75) Inventor: Brian D. McMinn, Buda, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/908,867

(22) Filed: Jul. 18, 2001

(51) Int. Cl.[7] .................................................. G11C 7/00
(52) U.S. Cl. ....................... 365/226; 365/227; 365/229; 365/233; 365/189.09
(58) Field of Search ................................. 365/226, 227, 365/229, 233, 189.09

(56) References Cited

U.S. PATENT DOCUMENTS

| | | | |
|---|---|---|---|
| 4,085,311 A | | 4/1978 | Ohsako et al. |
| 4,128,773 A | | 12/1978 | Troutman et al. |
| 4,638,464 A | * | 1/1987 | Cranford et al. ............ 365/226 |
| 5,740,102 A | | 4/1998 | Kawashima |
| 5,764,566 A | | 6/1998 | Akamatsu et al. |
| 5,825,705 A | * | 10/1998 | Tsukude et al. ............ 365/222 |
| 5,901,103 A | * | 5/1999 | Harris et al. ................ 365/201 |
| 5,959,926 A | * | 9/1999 | Jones et al. .................... 326/80 |
| 6,172,907 B1 | | 1/2001 | Jenne |
| 6,256,252 B1 | * | 7/2001 | Arimoto ...................... 365/222 |
| 6,426,908 B1 | * | 7/2002 | Hidaka ........................ 365/222 |

OTHER PUBLICATIONS

"AMD–K6, MMX Processor Data Sheet," AMD, 1997, 8 pages.
"AMD Athlon, Processor Model 4 Data Sheet," AMD, Publication #23792, Rev. H, Mar. 2001, pp. 9–17.
"AMD–766™ Peripheral Bus Controller Data Sheet," AMD, Mar. 2001, pp. 22–28.
"AMD–761™ System Controller Data Sheet," AMD Publication #24088, Rev: A–1, Feb. 2001, pp. 24–33.

* cited by examiner

*Primary Examiner*—Vu A. Le
*Assistant Examiner*—Toan Le
(74) *Attorney, Agent, or Firm*—Lawrence J. Merkel; Meyertons, Hood, Kivlin, Kowert & Goetzel, P.C.

(57) ABSTRACT

A storage circuit for an integrated circuit is configured to couple to a first power supply voltage (e.g. a $V_{dd}$ power supply voltage used by other circuitry within the integrated circuit) in response to a deassertion of a hold signal and configured to couple to a second power supply in response to an assertion of the hold signal. The second power supply voltage may be the hold signal voltage or another power supply voltage separate from the $V_{dd}$ power supply voltage. The hold signal may be asserted and the $V_{dd}$ power supply voltage may be removed. Leakage current in circuits powered only by the $V_{dd}$ power supply voltage may be eliminated, while the storage circuit may retain its stored value. A system including the integrated circuit and a method for managing power in the system.

13 Claims, 6 Drawing Sheets

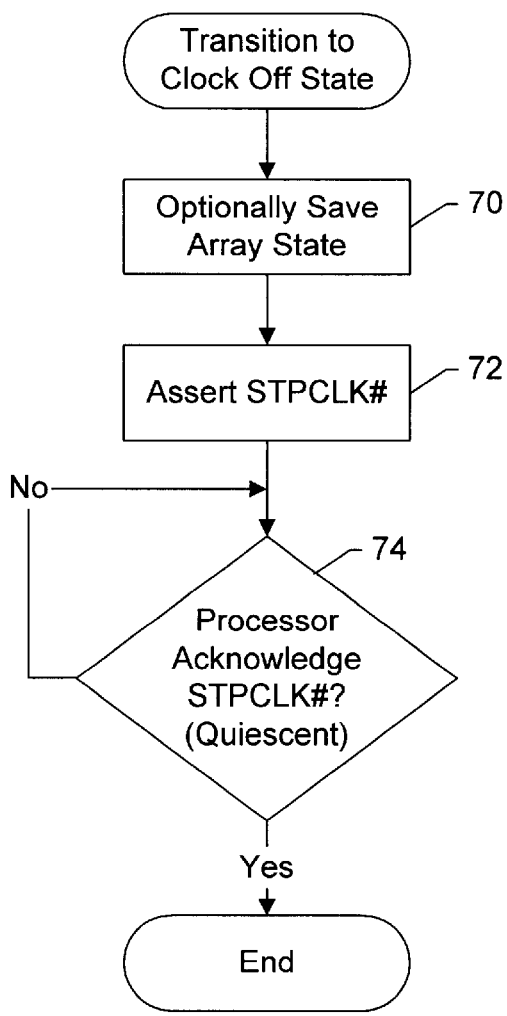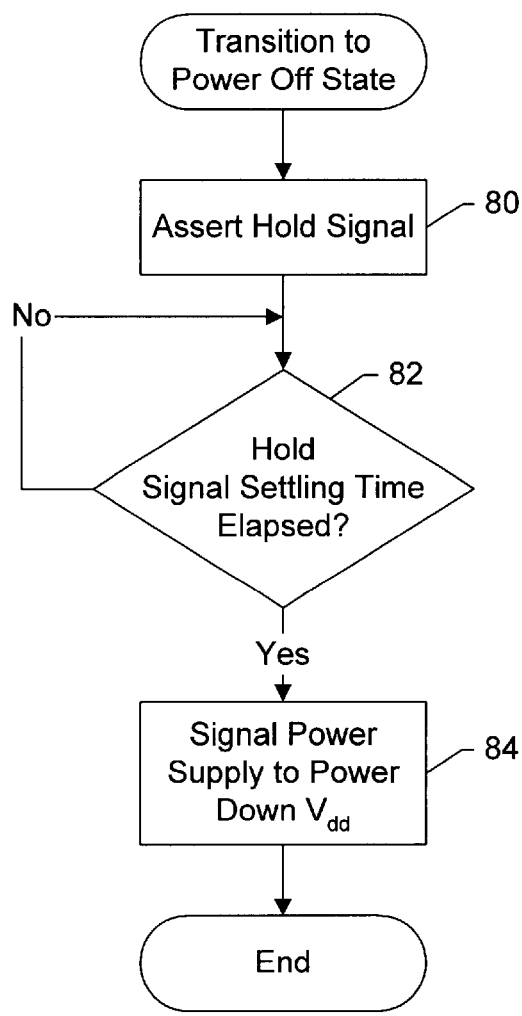
Fig. 6
Fig. 7

STORAGE CIRCUIT WITH DATA RETENTION DURING POWER DOWN

BACKGROUND OF THE INVENTION

1. Field of the Invention

This invention is related to the field of integrated circuits and, more particularly, to power saving modes in integrated circuits and storage circuit operation during the power saving modes.

2. Description of the Related Art

The power consumption of integrated circuits (and methods for minimizing such power consumption, particularly when a given integrated circuit is not in use) are an important design consideration for modern integrated circuit designers. Many systems which employ the integrated circuits may operate on battery power at least some of the time (e.g. laptop computers, personal digital assistants, cellular phones, etc.). Since a finite amount of energy is available from the battery, reducing use of power by circuits that are not in use lengthens the amount of time that a given battery may continue to power the system. Additionally, even in systems in which power is plentiful (e.g. those connected to a wall socket), reducing power consumption may be beneficial. Most of the power consumed in systems is radiated as heat, which generally must be removed from the system. The thermal stress on the system may be reduced by reducing power consumption of the integrated circuits.

Dynamic power reduction mechanisms have included reduction of the clock frequency of an integrated circuit if the full performance of the integrated circuit is temporarily not needed, even to the point of stopping the clock signal (i.e. a clock frequency of zero). Storage circuits within the integrated circuit retain their values, but switching within the integrated circuit stops since the state of the integrated circuit is not changing. Accordingly, power dissipation due to the switching action is reduced.

An additional source of power consumption in integrated circuits is the leakage current that occurs in transistors whenever there is a voltage difference applied to the transistor terminals, even if the transistors are not actively conducting current. The clock stopping mechanism described above reduces the switching power consumption, but does not reduce the leakage current power consumption.

The frequency at which the transistors switch increases as the gate length of the transistor decreases. Accordingly, semiconductor fabrication processes continue to be improved to provide for shorter gate lengths. The leakage current also increases as the gate length of the transistors decreases, and thus the power consumption of an integrated circuit which is attributable to the leakage current increases as the gate length of the transistors within the integrated circuit decreases.

In order to reduce power consumption due to leakage current, some dynamic power reduction mechanisms may cause the state of the integrated circuit to be saved (e.g. by writing the state to memory) and then remove the power supply voltage from the integrated circuit. When operation of the integrated circuit is desired again, the integrated circuit may be powered up and the state restored. The time required to save and restore the state may limit the opportunity to remove power from the integrated circuit as a power saving measure. Instead, when power conservation for shorter periods of time is possible, clock stopping techniques may generally be used. Additionally, it may be complicated to collect all of the state from the integrated circuit for writing to memory.

SUMMARY OF THE INVENTION

A storage circuit for an integrated circuit is described which is configured to couple to a first power supply voltage (e.g. a $V_{dd}$ power supply voltage used by other circuitry within the integrated circuit) in response to a deassertion of a hold signal and configured to couple to a second power supply in response to an assertion of the hold signal. The second power supply voltage may be the hold signal voltage or another power supply voltage separate from the $V_{dd}$ power supply voltage. In use, the hold signal may be asserted and the $V_{dd}$ power supply voltage may be removed. Leakage current in circuits powered only by the $V_{dd}$ power supply voltage may be eliminated, while the storage circuit may retain its stored value. When the $V_{dd}$ power supply is restored, the storage circuit may still be retaining its value and thus saving and restoring of the value in the storage circuit may not be required. A system including the integrated circuit and a method for managing power in a system including the integrated circuit are also described.

Broadly speaking, an apparatus is contemplated, comprising at least one memory cell having a power input and a circuit coupled to the power input. The circuit is coupled to receive a first power supply voltage and further coupled to receive a first signal. The circuit is configured to supply the first power supply voltage to the power input in response to the first signal being deasserted, and is configured to supply a second power supply voltage to the power input in response to the first signal being asserted.

Additionally, an integrated circuit is contemplated, comprising a plurality of storage circuits. Each storage circuit is coupled to receive a first signal, and is configured to couple to a first power supply voltage for power in response to the first signal being deasserted. Each storage circuit is further configured to couple to a second power supply voltage for power in response to the first signal being asserted.

Moreover, a system is contemplated. The system comprises an integrated circuit including a plurality of storage circuits and logic circuitry. Each storage circuit is coupled to receive a first signal, and is configured to couple to a first power supply voltage for power in response to the first signal being deasserted. Additionally, each storage circuit is configured to couple to a second power supply voltage for power in response to the first signal being asserted. The logic circuitry is coupled to the plurality of storage circuits and to receive the first power supply voltage. The system also comprises a control circuit configured to assert the first signal and to cause a removal of the first power supply voltage.

Still further, a method is contemplated. A first signal is asserted to a plurality of storage circuits. Each storage circuit is configured to couple to a first power supply voltage for power in response to the first signal being deasserted, and each storage circuit is configured to couple to a second power supply voltage for power in response to the first signal being asserted. The first power supply voltage is removed.

BRIEF DESCRIPTION OF DRAWINGS

The following detailed description makes reference to the accompanying drawings, which are now briefly described.

FIG. 6 is a flowchart illustrating one embodiment of a transition to a clock off state illustrated in FIG. 5.

FIG. 7 is a flowchart illustrating one embodiment of a transition to a power off state illustrated in FIG. 5.

Figure 1:
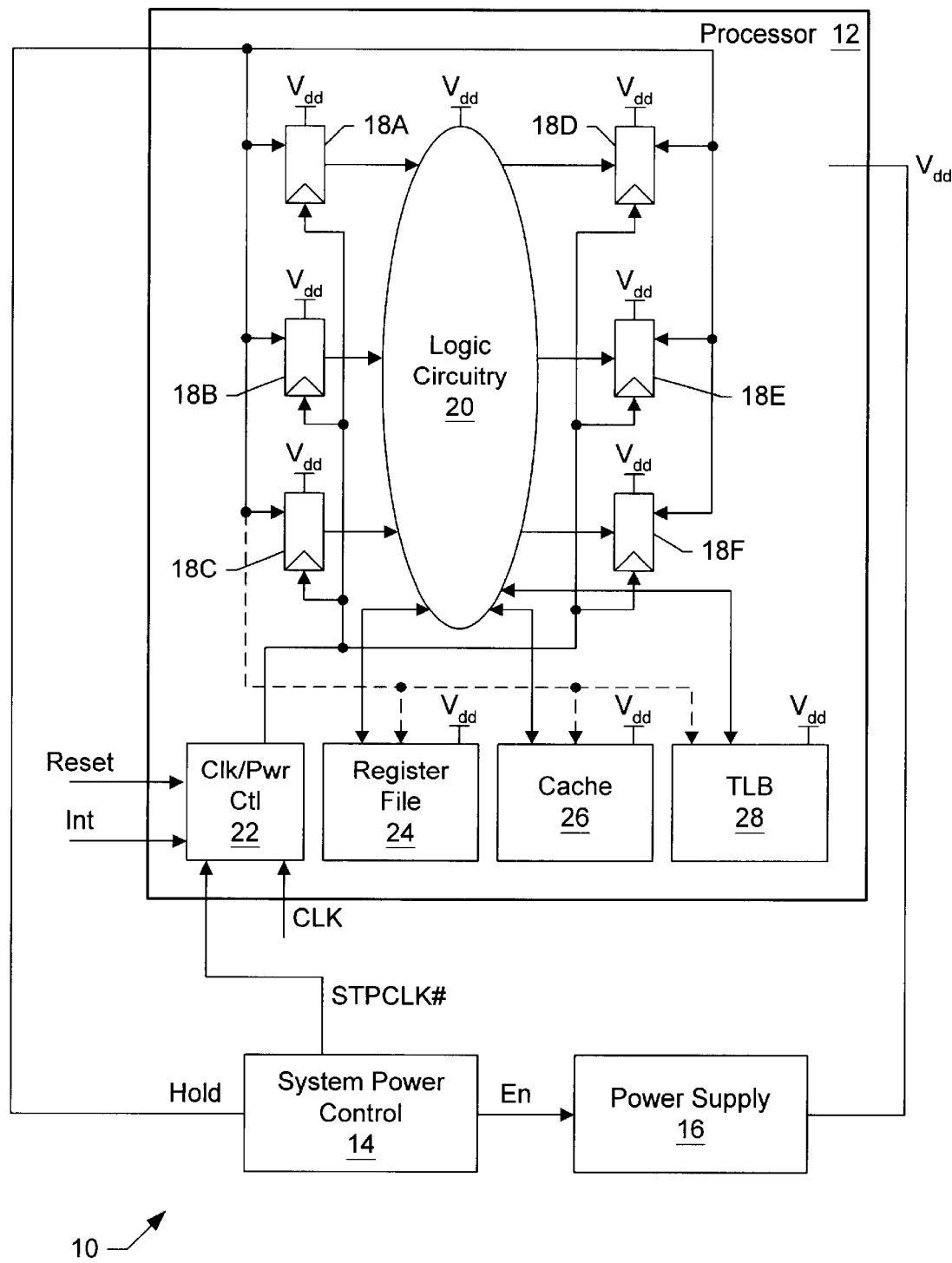
FIG. 1 is a block diagram of one embodiment of a system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to FIG. 1, a block diagram of one embodiment of a system 10 is shown. Other embodiments are possible and contemplated. In the embodiment of FIG. 1, the system 10 includes a processor 12, a system power control circuit 14, and a power supply circuit 16. The power supply circuit 16 is coupled to receive an enable signal from the system power control circuit 14 and is coupled to supply at least one power supply voltage to the processor 12 (i.e. $V_{dd}$ in FIG. 1). The system power control circuit 14 is further coupled to the processor (e.g. via a STPCLK# signal and a hold signal in FIG. 1). The processor 12 is coupled to receive a clock input (CLK), as well as a reset input (Reset) and one or more interrupt inputs (Int).

In the embodiment of FIG. 1, the processor 12 includes a set of storage circuits 18A–18F, logic circuitry 20, a clock/power control circuit 22, a register file 24, a cache 26, and a translation lookaside buffer (TLB) 28. The storage circuits 18A–18C are coupled to provide input to the logic circuitry 20, which is coupled to provide outputs to the storage circuits 18D–18F. Additionally, the logic circuitry 20 is coupled to communicate with the register file 24, the cache 26, and the TLB 28. The clock/power control circuit 22 is coupled to receive the CLK, STPCLK#, reset, and interrupt inputs and to provide a clock input to the storage circuits 18A–18F. Each of the storage circuits 18A–18F, the logic circuitry 20, the register file 24, the cache 26, and the TLB 28 are coupled to receive the $V_{dd}$ power supply voltage. The storage circuits 18A–18F are coupled to receive the hold signal from the system power control circuit 14. Optionally, one or more of the register file 24, the cache 26, and the TLB 28 may be coupled to receive the hold signal as well (illustrated by a dashed line in FIG. 1).

The clock/power control circuit 22 is configured to generate a clock (referenced from the input clock signal CLK) and to distribute the clock signal to the clocked storage circuits (e.g. storage circuits 18A–18F) within the processor 12. The memory arrays (e.g. the cache 26, the TLB 28, and/or the register file 24) may also receive the clock signal if used to read/write the memory arrays. In some implementations, the clock/power control circuit 22 may include a phase locked loop. Additionally, the clock/power control circuit 22 may be configured to stop the clock signal (i.e. hold the clock signal steady at a high or a low value instead of transitioning repetitively at the desired clock frequency) responsive to the stop clock signal (STPCLK#). An exemplary embodiment is described in more detail below.

While the clock is stopped, the logic circuitry 20 generally does not exhibit switching activity (since the storage circuits feeding the logic circuitry are holding steady values due to the stopped clock). Thus, the processor 12 may not be dissipating power due to switching activity. However, the processor 12 may still be dissipating power due to leakage currents.

The system power control circuit 14 is configured to reduce the power dissipation due to leakage current by causing the power supply circuit 16 to remove the power supply voltage from the processor 12. The processor 12 may employ storage circuits which may retain state when the power supply voltage is removed. In the embodiment of FIG. 1, the system power control circuit 14 asserts the hold signal to the processor 12. The hold signal is coupled to the storage circuits 18A–18F. Specifically, the hold signal, when asserted, causes the storage circuits 18A–18F to use a second power supply voltage different from the $V_{dd}$ power supply voltage as the power input to the memory cells within the storage circuits 18A–18F. The second power supply voltage may remain active when the $V_{dd}$ power supply voltage is removed. Thus, the storage circuits retain the stored state even though the $V_{dd}$ power supply voltage has been removed. Other circuitry, such as the logic circuitry 20, may not be coupled to the hold signal and the second power supply voltage. Leakage current in the logic circuitry 20 (and other circuitry powered only by the $V_{dd}$ power supply voltage, e.g. the register file 24, the cache 26, and/or the TLB 28 in embodiments in which these memories are not coupled to the hold signal) may be eliminated by removing the $V_{dd}$ power supply voltage.

In one embodiment, the second power supply voltage is the hold signal itself (e.g. see FIG. 2 below). Other embodiments may supply a second power supply voltage separate from the hold signal (e.g. see FIG. 3 below). In either case, the second power supply voltage may not be required to supply large amounts of current. Thus, the second power supply voltage/hold signal may be routed relatively freely within the processor 12. For example, the second power supply voltage/hold signal may be treated as an ordinary signal wire for routing purposes. On the other hand, the $V_{dd}$ power supply voltage may be carefully routed to ensure that large amounts of current occurring due to digital switching may be supplied. For example, standard cell integrated circuit designs often use a power plane formed from power lines above each row of circuit cells, connected together at the ends, to supply power. A plurality of pins on the integrated circuit are used to supply power, and the pins are coupled to the power bars at various points around the circuit. Furthermore, since dynamic activity in the processor 12 may be stopped when the hold signal is asserted, capacitive coupling to adjacent wires may not be a concern in routing the wire for carrying the hold signal.

The memory arrays (e.g. the register file 24, the cache 26, and the TLB 28) may or may not be coupled to the hold signal and may or may not retain state when the $V_{dd}$ power supply voltage is removed. In some cases, it may be acceptable to lose the state stored in the memory arrays. For example, instruction caches typically store unmodified copies of instructions from memory, and thus may be refetched from memory when the processor 12 is powered up again. Similarly, the TLBs are often designed not to store modified data. The translations may be refetched from memory when the processor 12 is powered up again. On the other hand, for memory arrays for which retaining the state is desired, the contents of the arrays may be stored to memory prior to powering down the $V_{dd}$ power supply voltage. The state may be restored from memory once the $V_{dd}$ power supply voltage is restored. Alternatively, one or more of the memory arrays may be supplied with the hold signal/second power supply and thus may retain their state as well.

Generally, the storage circuits 18A–18C provide inputs to the logic circuitry 20, which operates on the inputs and produces outputs for storage in the storage circuits 18D–18F. The logic circuitry 20 comprises any non-state-storing circuitry (e.g. circuits corresponding to combinatorial logic gates, custom circuits such as adders, multipliers, etc.). The storage circuits comprise memory cells for storing state (one or more bits of information) for use by other logic circuitry. The storage circuits 18A–18F and the logic circuitry 20 are exemplary of logic circuitry and storage circuits which may comprise the processor 12 (e.g. additional logic circuitry may be coupled to receive the outputs of the storage circuits 18D–18F and may be coupled to still more storage circuits, and additional logic circuitry may calculate the inputs to the storage circuits 18A–18C).

The register file 24 may include memory locations corresponding to the architected registers of the processor 12. In some implementations, the register file 24 may be implemented as a memory array such as a random access memory (RAM) array. In other implementations, the register file may comprise individual storage circuits for each register, plus circuitry for selecting the registers to be read/written based on input register addresses.

The cache 26 may be a cache memory for storing copies of data from a main memory. The cache 26 may be illustrative of an instruction cache, a data cache, both an instruction cache and a data cache, or a combined instruction/data cache that may be employed in various embodiments of the processor 12. Furthermore, the cache 26 may be illustrative of multiple levels of caching that may be employed in various embodiments of the processor 12. The cache 26 may be implemented as a memory array such as a RAM array, a content addressable memory (CAM) array, etc.

The TLB 28 may be a cache for translations from virtual addresses to physical addresses. Similar to the cache 26, the TLB 28 may be illustrative of an instruction TLB, a data TLB, both an instruction TLB and a data TLB, or a combined instruction/data TLB that may be implemented in various embodiments of the processor 12. Furthermore, the TLB may be illustrative of multiple levels of TLBs that may be employed in various embodiments of the processor 12. The TLB 28 may be implemented as a memory array such as a RAM array, a CAM array, etc.

It is noted that, while the $V_{dd}$ power supply is shown in FIG. 1, various processor embodiments may receive more than one power supply voltage. For example, processor embodiments may receive a separate $V_{I/O}$ power supply voltage for driver circuits used to communicate on the pins of the processor. The $V_{I/O}$ power supply voltage may be greater than the $V_{dd}$ power supply voltage and may allow for simpler interfacing to other circuits than if the lower $V_{dd}$ power supply voltage were used. Additionally, embodiments using a phase locked loop may receive a separate power supply voltage for the phase locked loop. These various voltages may also be removed when $V_{dd}$ is removed, or may remain powered, as desired.

It is noted that various embodiments of the system 10 may include a variety of other components, as desired. For example, in one embodiment, the system 10 may be a personal computer system. In such an embodiment, the system power control circuit 14 may be included in a Southbridge circuit which bridges from the peripheral component interconnect (PCI) bus to various legacy buses such as the industry standard (ISA) bus, the universal serial bus (USB), etc. A Northbridge may also be included for bridging from the processor 12 to the PCI bus, to a memory, and to an advanced graphics port (AGP) device. Various peripheral components may be included as well, coupled to any of the peripheral connections with the personal computer system. Other embodiments may include cell phones, personal digital assistants, etc., with various other components as desired.

It is noted that, while a processor is shown as the circuit employing the storage circuits which use the hold signal for data retention, any integrated circuit of any type may utilize the storage circuits in a similar fashion. As used herein, a "storage circuit" refers to any circuit configured to store one or more bits of data. Exemplary storage circuits may include flip-flops (flops), latches, registers, memory arrays, etc.

Various signals are referred to herein as being asserted or deasserted. A signal is asserted at a first voltage level defined to indicate a first condition, and is deasserted at a second voltage level different from the first voltage level. The first voltage level may be a high voltage (e.g. $V_{dd}$ or $V_{I/O}$) and the second voltage level may be a low voltage (e.g. Gnd). Alternatively, the first voltage may be a low voltage level and the second voltage may be a high voltage level. Alternatively, for differential signalling, the first voltage level may be a first differential and the second voltage level may be a second differential.

Figures 2, 3:
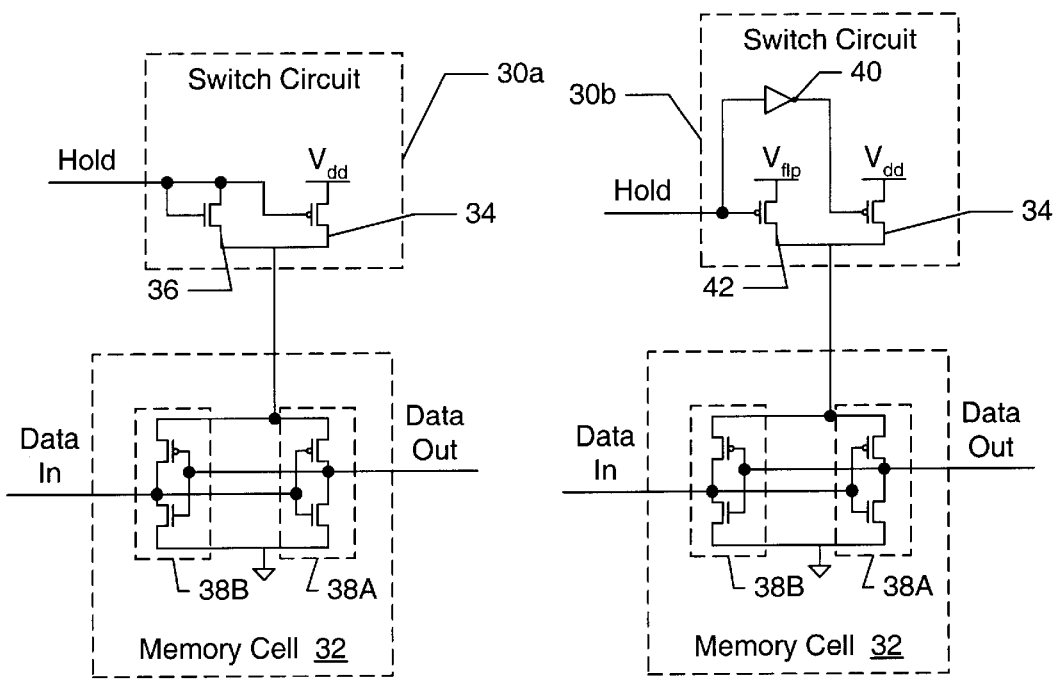
FIG. 2 is a circuit diagram of one embodiment of a portion of a storage circuit.
FIG. 3 is a circuit diagram of a second embodiment of a portion of the storage circuit.

Turning next to FIG. 2, a circuit diagram of a first embodiment of a portion of a storage circuit is shown. Other embodiments are possible and contemplated. In the embodiment of FIG. 2, the portion of the storage circuit includes a switch circuit 30a and a memory cell 32. The switch circuit 30a is coupled to receive the hold signal and is coupled to receive the $V_{dd}$ power supply voltage. The switch circuit 30a is further coupled to a power input of the memory cell 32. The memory cell 32 is coupled to receive a data input and to provide a data output.

Generally, the switch circuit 30a is configured to switch between the $V_{dd}$ power supply voltage and a second power supply voltage responsive to the hold signal. In the embodiment of FIG. 2, the second power supply voltage is the hold signal itself. In other embodiments (e.g. FIG. 3), a separate second power supply voltage may be provided. The switch circuit 30a may supply the power input of the memory cell 32 from the $V_{dd}$ power supply voltage if the hold signal is deasserted (and the second power supply voltage may not be in use). The switch circuit 30a may supply the power input of the memory cell 32 from the hold signal voltage if the hold signal is asserted (and the $V_{dd}$ power supply voltage may not be in use). Accordingly, if the hold signal is asserted, the $V_{dd}$ power supply voltage may be powered off and the memory cell 32 may still be supplied with power for holding the value stored therein.

In the illustrated embodiment, the switch circuit 30a may include a p-type metal-oxide-semiconductor (PMOS) transistor 34 and an n-type MOS (NMOS) transistor 36. If the hold signal is deasserted (low, in the embodiment of FIG. 2), the PMOS transistor 34 is activated (since its gate terminal is coupled to the hold signal). The source/drain path of the transistor 34 is coupled between a power supply line carrying the $V_{dd}$ power supply voltage and the power input of the memory cell 32. Thus, if the hold signal is deasserted, the transistor 34 couples the $V_{dd}$ power supply voltage to the power input of the memory cell 32. If the hold signal is asserted, the transistor 34 deactivates and the $V_{dd}$ power supply voltage is not coupled to the power input (i.e. the transistor 34 isolates the power input from the $V_{dd}$ power supply voltage). The hold signal is also coupled to the gate terminal of the NMOS transistor 36. The NMOS transistor 36 has a source/drain path coupled between a signal line carrying the hold signal and the power input of the memory cell 32. If the hold signal is deasserted, the transistor 36 is deactivated and the hold signal voltage is not coupled to the power input of the memory cell 32. On the other hand, if the hold signal is asserted, the transistor 36 activates and the hold signal voltage is coupled to the power input of the memory cell 32.

Accordingly, if the hold signal is deasserted, the $V_{dd}$ power supply voltage supplies the power for the memory cell 32. If the hold signal is asserted, the hold signal voltage supplies the power for the memory cell 32. In the illustrated embodiment, since the transistor 36 is an NMOS transistor supplying a positive voltage to the power input, the voltage on the power input when the hold signal is asserted is less than the hold signal voltage by the threshold voltage of the NMOS transistor. Assuming that the hold signal voltage is approximately the same voltage as the $V_{dd}$ power supply voltage, the amount of leakage current experienced in the memory cell 32 when powered by the hold signal voltage may be less than the leakage current experienced in the memory cell 32 when powered by the $V_{dd}$ power supply voltage.

In the illustrated embodiment, the memory cell 32 includes a pair of cross-coupled inverters 38A–38B. In other words, the output of each inverter 38A–38B is coupled as the input of the other inverter 38A–38B. The transistors forming the inverters are illustrated within the dashed boxes labeled 38A–38B. The power input of each of the inverters 38A–38B is the power input of the memory cell 32 (i.e. the PMOS transistors of each inverter are coupled to the power input). When a new data bit is provided as the data input for storage, the transistors driving the data bit may overdrive the inverter 38B (if the new bit differs from the current stored bit) and cause the cross-coupled inverters and to store the new data bit. It is noted that the memory cell 32 may include other transistors, as desired. For example, if the storage circuit of which FIG. 2 is a portion is a latch or a flop, a transistor (or a passgate connection of two transistors) may be coupled between the transistors driving the data bit and the cross-coupled inverters 38A–38B. The gate terminal of the transistor may be coupled to the clock (or a signal derived from the clock) to pass the input value into the memory cell 32 for storage. If the storage circuit is a memory array, the data in and data out nodes of the memory cell 32 may be used as differential read/write lines. Transistors may be coupled between the nodes and a pair of bit lines used to differentially read and write the memory cell 32. Any additional circuitry may be included to form various types of storage circuits.

Turning next to FIG. 3, a circuit diagram of a second embodiment of a portion of a storage circuit is shown. Other embodiments are possible and contemplated. In the embodiment of FIG. 3, the portion of the storage circuit includes a switch circuit 30b and the memory cell 32. The switch circuit 30b is coupled to receive the hold signal, the $V_{dd}$ power supply voltage, and a second power supply voltage ($V_{flp}$) separate from the hold signal. The switch circuit 30b, similar to the switch circuit 30a, is further coupled to a power input of the memory cell 32. The memory cell 32 is coupled to receive a data input and to provide a data output.

The switch circuit 30b in FIG. 3 may generally operate in a manner similar to the switch circuit 30a, powering the power input from one of the first and second power supplies. Specifically, if the hold signal is deasserted, the switch circuit 30b supplies the power input from the $V_{dd}$ power supply voltage. If the hold signal is asserted, the switch circuit 30b supplies the power input from the $V_{flp}$ power supply voltage.

In the illustrated embodiment, the switch circuit 30b includes a PMOS transistor 34 similar to the like numbered transistor in the switch circuit 30a. However, the gate terminal of the transistor 34 is coupled to receive an inversion of the hold signal through the inverter 40. In this embodiment, the hold signal may be defined to be asserted when low. Thus, if the hold signal is asserted, the transistor 34 may be deactivated and the power input of the memory cell 32 is not supplied from the $V_{dd}$ power supply voltage. On the other hand, if the hold signal is deasserted, the transistor 34 may be activated and the power input of the memory cell 32 is supplied from the $V_{dd}$ power supply voltage. The switch circuit 30b also includes a PMOS transistor 42 having a source/drain path coupled between the $V_{flp}$ power supply voltage and the power input of the memory cell 32. The transistor 42 is coupled to receive the hold signal. Thus, if the hold signal is asserted, the transistor 42 may be activated and the power input of the memory cell 32 is supplied from the $V_{flp}$ power supply voltage. On the other hand, if the hold signal is deasserted, the transistor 42 may be deactivated and the power input of the memory cell 32 is not supplied from the $V_{flp}$ power supply voltage.

It is noted that the inverter 40 may be supplied by the $V_{flp}$ power supply voltage, so that the inverter remains active when the $V_{dd}$ power supply voltage is powered off. It is further noted that another embodiment of the switch circuit 30b may place the inverter 40 between the hold signal and the gate terminal of the transistor 42 and the gate terminal of the transistor 34 may be coupled to receive the hold signal. In such an embodiment, the hold signal may be defined to be asserted high. Still further, an embodiment of the switch circuit 30b may use an NMOS transistor as transistor 42. In such an embodiment, the inverter 40 may be eliminated and the hold signal may be defined to be asserted high.

It is noted that, while the memory cell 32 illustrated in FIGS. 2 and 3 comprises cross-coupled inverters, other embodiments may include other types of cross-coupled circuits. For example, cross-coupled NAND or NOR gates may be used. Generally, a memory cell is a circuit configured to store one or more bits of data. Additionally, while one memory cell 32 is illustrated in FIGS. 2 and 3, generally a storage circuit may include one or more memory cells. If more than one memory cell is used, some embodiments may couple the switch circuit 30a or 30b to more than one memory cell. In other words, one switch circuit may supply the power input of two or more memory cells.

Figure 4:
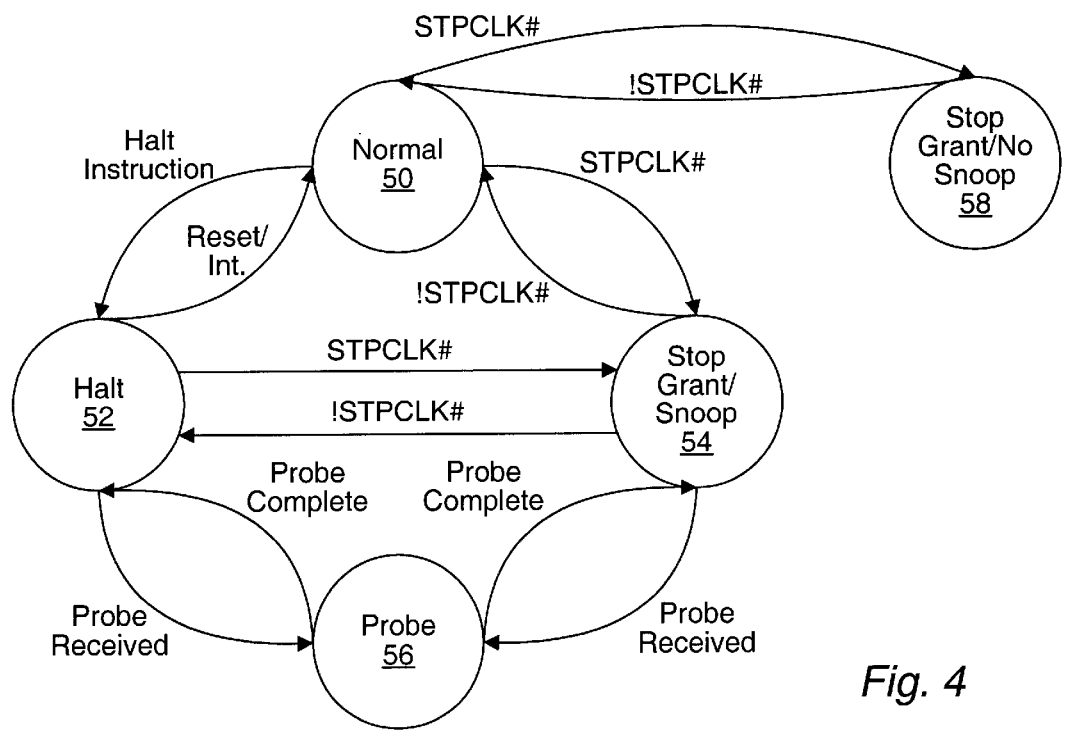
FIG. 4 is a state machine diagram illustrating one embodiment of a state machine which may be employed by one embodiment of a processor shown in FIG. 1.

Turning next to FIG. 4, a state machine diagram illustrating a state machine that may be employed by one embodiment of the processor 12 is shown. Other embodiments are possible and contemplated. The state machine shown in FIG. 4 may be implemented in the clock/power control circuit 22, for example.

The state machine includes a normal state 50, a halt state 52, a stop grant/snoop state 54, a probe state 56, and a stop grant/no snoop state 58. The normal state 50 may be the full power state in which the processor 12 is operating normally, executing instructions. The internal clock (e.g. to the storage circuits 18A–18F in FIG. 1) is operating in the normal state 50. The halt state 52, the stop grant/snoop state 54, and the stop grant/no snoop state 58 are low power states in the which the processor 12 is not executing instructions. The internal clock of the processor 12 is stopped in these states. The probe state 56 is used to allow probes of the internal caches of the processor 12 while the processor is in either the stop grant/snoop state 54 or the halt state 52.

The state machine transitions from the normal state 50 to the halt state 52 in response to executing a halt instruction. The state machine transitions from the halt state 52 to the normal state 50 in response to receiving a reset or interrupt.

The state machine transitions from the normal state 50 to either the stop grant/no snoop state 58 or the stop grant/snoop state 54 in response to an assertion of the STPCLK# signal. The state machine returns from either of these states to the normal state 50 in response to a deassertion of the STPCLK# signal (!STPCLK# in FIG. 4). Generally, a probe may be performed to the processor 12 internal caches from the stop grant/snoop state 54 but not from the stop grant/snoop state 58. In one embodiment, the processor 12 selects the stop grant/snoop state 54 in response to an assertion of the STPCLK# signal if the assertion of the STPCLK# signal is performed in response to a read by the processor of a register in the system power control circuit 14. Otherwise, the stop grant/no snoop state 58 may be selected. Additionally, the state machine transitions from the halt state 52 to the stop grant/snoop state 54 in response to an assertion of the STPCLK# signal and returns to the halt state 52 in response to a deassertion of the STPCLK# signal. Generally, the transition from the stop grant/snoop state 54 to the halt state 52 or the normal state 50 is governed by the state from which the state machine transitions to the stop grant/snoop state 54 (i.e. the state machine returns to the same state from which the transition to the stop grant/snoop state 54 occurs).

Generally, the transition to any of the stop grant/no snoop state 58, the stop grant/snoop state 54, or the halt state 52 is performed after the processor 12 stops dynamic activity (i.e. instruction execution may be halted at some point in the code sequence being executed, and any effects of the executed instructions are completed, such a transactions on the interface of the processor 12) in response to the halt instruction or the assertion of STPCLK#. The processor 12 may signal the system 10 that the halt instruction/STPCLK# assertion has been recognized. For example, the processor 12 may drive a special halt transaction or stop grant transaction on its interface to indicate that the halt instruction or STPCLK# assertion has been recognized, respectively. Other embodiments may supply one or more signals to indicate that such recognition. Once the signalling has occurred, the processor 12 may stop its internal clock. Accordingly, any of the stop grant/no snoop state 58, the stop grant/snoop state 54 or the halt state 52 may be suitable states of the processor 12 for asserting the hold signal. The $V_{dd}$ power supply voltage may then be powered down.

As mentioned above, the system 10 may issue probes to the processor 12 while the processor 12 is in the halt state 52 or the stop grant/snoop state 54. If a probe is issued, the processor 12 may start its internal clock and transition to the probe state 56. While in the probe state 56, the processor 12 may check its internal caches for the cache block affected by the probe, and respond to the probe in the same fashion as would occur in the normal state 50 (including writing back the cache block to memory). After completing the probe, the processor 12 may return to whichever of the halt state 52 and the stop grant/snoop state 54 was in effect before the transition of the probe state 56.

It is noted that the state machine illustrated in FIG. 4 is merely exemplary. The state machine shown may be one implementation of a state machine for implementing a power management scheme referred to as Advanced Configuration and Power Interface (ACPI). Other state machines may be used with ACPI, and other state machines may be used for power conservation which is different from the ACPI scheme. In any such embodiment, a state in which the clocks have been stopped may be a suitable state to assert the hold signal.

Figure 5:
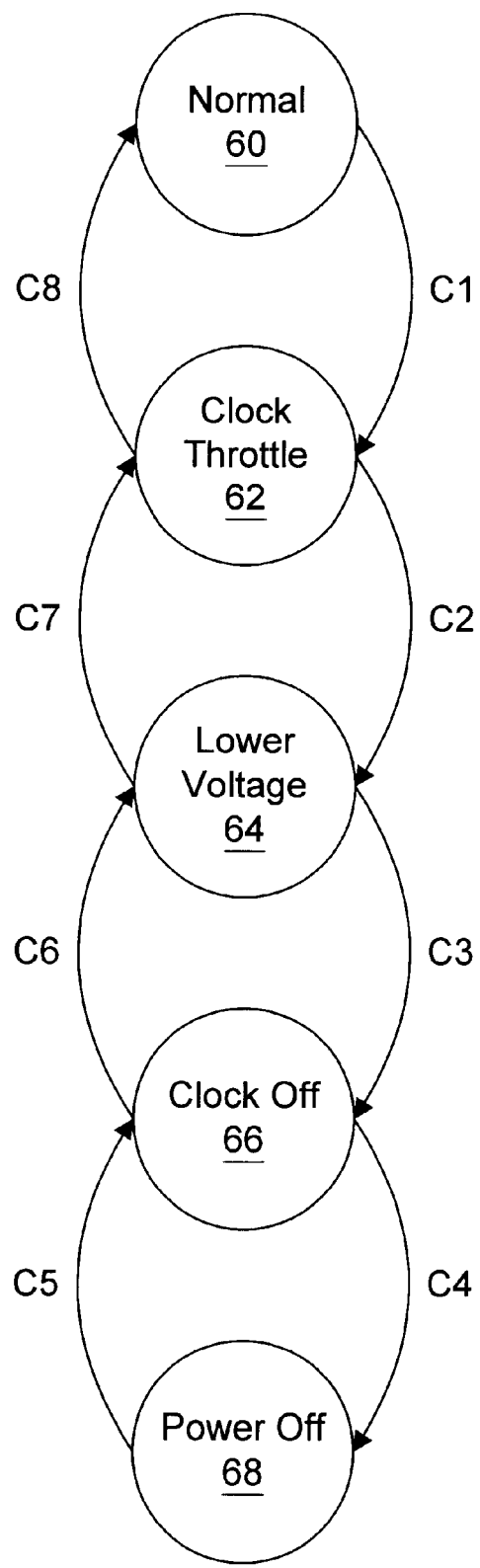
FIG. 5 is a state machine diagram illustrating one embodiment of a state machine which may be employed by one embodiment of a system power control circuit shown in FIG. 1.

Turning next to FIG. 5, a state machine diagram of one embodiment of a state machine that may be employed by one embodiment of the system power control circuit 14 is shown. Other embodiments are possible and contemplated.

The state machine of FIG. 5 includes a normal state 60, a clock throttle state 62, a lower voltage state 64, a clock off state 66, and a power off state 68. The normal state 60 may be a full power state in which various devices in the system 10 (including the processor 12) may operate at full power. In the clock throttle state 62, the system power control circuit 14 may throttle the internal clock of the processor 12 by toggling the STPCLK# signal periodically. In the lower voltage state 64, the system power control circuit 14 may lower the power supply voltage ($V_{dd}$) to the processor 12 (possibly in conjunction with lowering the clock frequency). In the clock off state 66, the system power control circuit 14 causes the clock of the processor 12 to be stopped (e.g. using the assertion of the STPCLK# signal, in a steady state as opposed to the toggling of the STPCLK# signal used in the clock throttle state 62). In the power off state 68, the system power control circuit 14 causes the $V_{dd}$ power supply voltage to be removed (e.g. using the enable signal to the power supply circuit 16).

Generally, the system power control circuit 14 may monitor the activity in the system 10 to determine when to make transitions between states. Specifically, various criteria (C1–C8 in FIG. 5) may be used to cause a transition between states. Any set of criteria may be used. Additionally, although transitions between adjacent states are used in FIG. 5, other embodiments may allow states to be skipped (either in the direction of lowering power consumption or in the direction of increasing power consumption), as desired.

It is noted that the state machine illustrated in FIG. 5 is exemplary, and any state machine may be used. For example, various other state machines corresponding to the ACPI standard may be used.

Turning now to FIG. 6, a flowchart is shown illustrating certain activities which may occur when transitioning to the clock off state 66. Other embodiments are possible and contemplated.

The state of one or more memory arrays in the processor 12 which do not receive the hold signal may optionally be saved, e.g. to an external memory to the processor 12, such as a main memory in a personal computer system (block 70). Block 70, if included, may be implemented in a variety of ways. Additionally, block 70 may be performed after block 72, or in response to block 72. Software may be used to write the state of the memory arrays to memory. Alternatively, the processor 12 may save the state of the memory arrays. For example, block 70 may be performed by the processor in response to an assertion of the STPCLK# signal (in which case block 70 may be performed after block 72). In some embodiments, the processor 12 may include a microcode routine which, when executed, saves the state of the memory arrays. The memory arrays may be saved using a hardware interface to the processor 12 (e.g. the JTAG interface). Any mechanism for saving the memory array state may be used. In other embodiments, any memory array state which is desired may implement the hold signal for retaining state.

The system power control circuit 14 asserts the STPCLK# signal to the processor 12 (block 72). The system power control circuit 14 waits for the processor to acknowledge the STPCLK# assertion (decision block 74). In other words, the system power control circuit 14 waits for the processor 12 to reach a quiescent state in which dynamic activity has ceased. Once the acknowledgement of the STPCLK# signal has occurred, the system power control circuit 14 may complete the transition to the clock off state 66.

Turning next to FIG. 7, a flowchart is shown illustrating certain activities which may occur when transitioning to the power off state 68. Other embodiments are possible and contemplated.

The system power control circuit 14 asserts the hold signal to the processor 12 (block 80), thus powering the memory cells in the storage circuits with the second power supply voltage (e.g. the hold signal itself, or the $V_{flp}$ power supply voltage). The system power control circuit 14 may wait for a period of time for the hold signal to propagate through the processor 12 and stabilize (decision block 82). For example, a time period on the order of milliseconds may be used. Alternatively, longer or shorter intervals may be used. After the settling interval has elapsed, the system power control circuit 14 may signal the power supply circuit 16 to power down the $V_{dd}$ power supply voltage (block 84). For example, the system power control circuit 14 may deassert the enable signal to the power supply circuit 16 as shown in FIG. 1. The system power control circuit 14 may complete the transition to the power off state 68.

Figure 8:
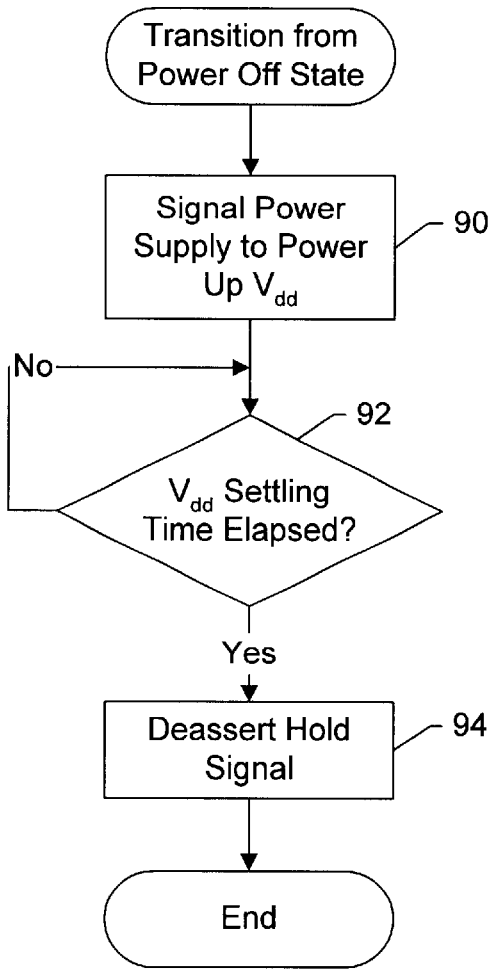
FIG. 8 is a flowchart illustrating one embodiment of a transition from a power off state illustrated in FIG. 5.

Turning next to FIG. 8, a flowchart is shown illustrating certain activities which may occur when transitioning from the power off state 68 (e.g. to the clock off state 66). Other embodiments are possible and contemplated.

The system power control circuit 14 signals the power supply circuit 16 to power up the $V_{dd}$ power supply voltage (block 90). For example, the system power control circuit 14 may assert the enable signal to the power supply circuit 16 as shown in FIG. 1. The system power control circuit 14 may wait for a period of time for the $V_{dd}$ power supply voltage to stabilize within the processor 12 (decision block 92). Again, a time period on the order of milliseconds may be used, although other embodiments may have longer or shorter time intervals. After the settling interval has elapsed, the system power control circuit 14 may deassert the hold signal (block 94), thus powering the memory cells in the storage circuits with the $V_{dd}$ power supply voltage.

Figure 9:
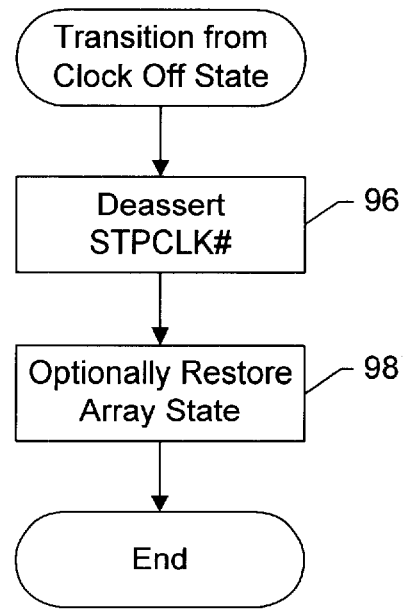
FIG. 9 is a flowchart illustrating one embodiment of a transition from a clock off state illustrated in FIG. 5.

Turning now to FIG. 9, a flowchart is shown illustrating certain activities which may occur when transitioning from the clock off state 66 to a higher power consumption/performance state. Other embodiments are possible and contemplated.

The system power control circuit 14 deasserts the STPCLK# signal (block 96). Thus, the internal clock of the processor 12 starts toggling again. Optionally, memory array state saved during the transition to the clock off state 66 may be restored (block 98).

It is noted that, while separate clock off and power off states are shown in FIG. 5, other embodiments may employ a combined clock off/power off state. In such embodiments, the activities of FIGS. 6 and 7 may be combined and the activities of FIGS. 8 and 9 may be combined.

Figure 10:
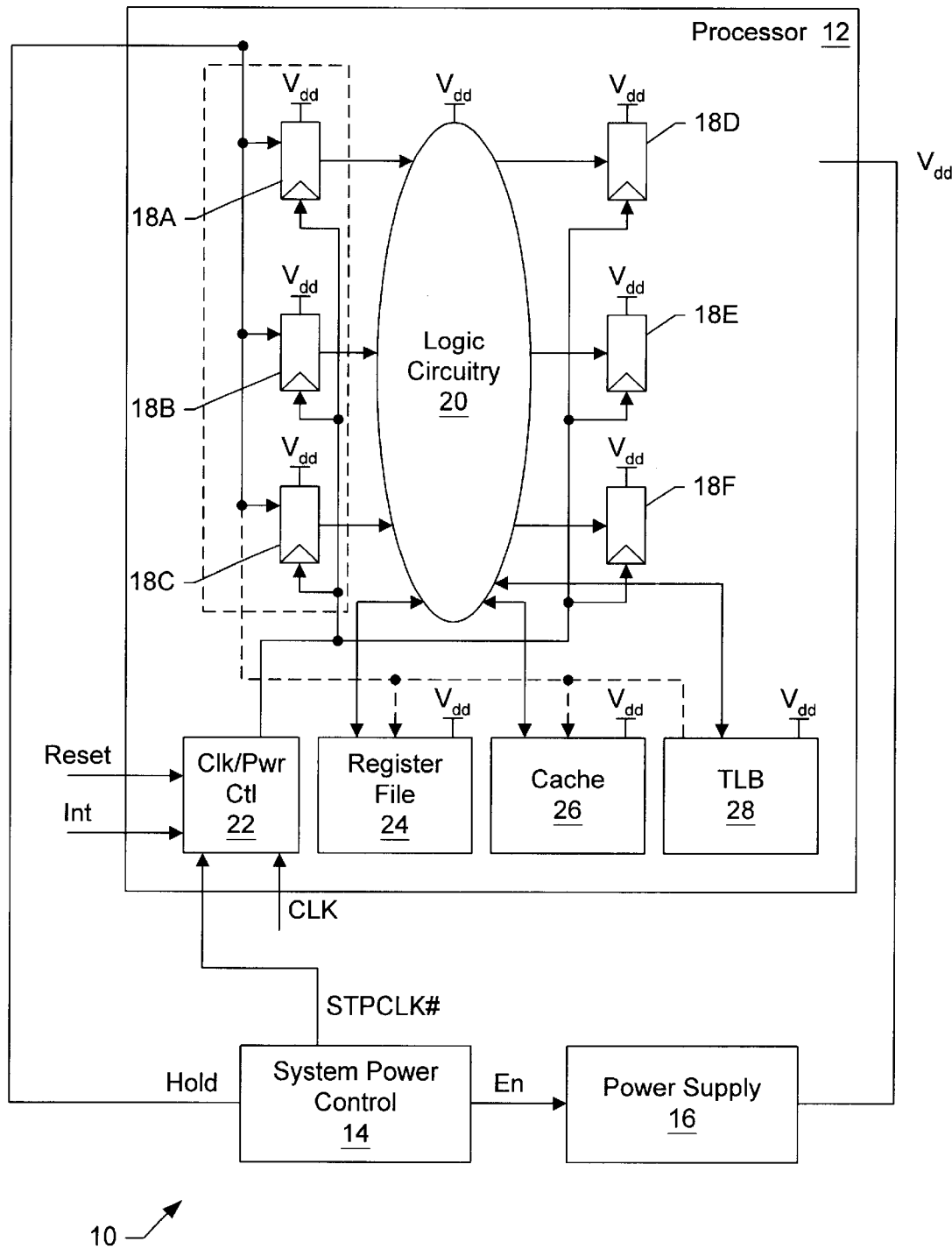
FIG. 10 is a block diagram of a second embodiment of a system.

Turning next to FIG. 10, a block diagram of a second embodiment of the system 10 is shown. Other embodiments are possible and contemplated. The embodiment of FIG. 10 is generally similar to the embodiment of FIG. 1. However, the processor 12 in the embodiment of FIG. 10 includes a portion of the storage circuits 18 coupled to the hold signal (and operating as described with regard to FIG. 1) while other storage circuits 18 are not coupled to the hold signal (and thus do not retain their state if the $V_{dd}$ power supply voltage is removed).

The embodiment of FIG. 10 may be used to preserve certain state in processor 12 while other state is not retained. Such an embodiment may have a variety of uses. Generally, it may be desirable to maintain certain state within the processor 12 so that the state is not written to memory. For example, state which is intended to be kept secure may be retained within the processor (not written to memory). Such state may include passwords, keys for encryption/decryption, etc. In one specific example, encrypted media (e.g. music, movies, etc.) may be downloaded into the system 10 (e.g. from the Internet), including secure state (passwords, keys, etc.) used to decrypt the music, movies, etc. The encrypted media may be read into the processor 12 (e.g. into the cache 26) and decrypted in the cache 26. If the $V_{dd}$ power supply voltage is subsequently removed to enter a low power state, the decrypted media data in the cache may be lost. The encrypted media may be stored in memory. However, the secure state may be stored in storage circuits such as storage circuits 18A–18C, and thus may be retained. When the processor 12 is powered up again (the $V_{dd}$ power supply voltage is supplied), the secure state is retained in the processor 12 and thus the encrypted media may be decrypted again without having to download the media again.

Numerous variations and modifications will become apparent to those skilled in the art once the above disclosure is fully appreciated. It is intended that the following claims be interpreted to embrace all such variations and modifications.

What is claimed is:

1. An apparatus comprising:
   at least one memory cell having a power input; and
   a circuit coupled to the power input and to receive a first power supply voltage and further coupled to receive a first signal, wherein the circuit is configured to supply the first power supply voltage to the power input in response to the first signal being deasserted, and wherein the circuit is configured to supply a second power supply voltage to the power input in response to the first signal being asserted, wherein the second power supply voltage is the first signal, and wherein the circuit comprises a first transistor coupled between a first signal line carrying the first signal and the power input, the first transistor having a gate terminal coupled to receive the first signal.

2. The apparatus as recited in claim 1 wherein the circuit further comprises a second transistor coupled between a power supply line carrying the first power supply voltage and the power input, the second transistor having a gate terminal coupled to receive the first signal.

3. The apparatus as recited in claim 2 wherein the first transistor is n-type and the second transistor is p-type.

4. An apparatus comprising:
   at least one memory cell having a power input; and a circuit coupled to the power input and to receive a first power supply voltage and further coupled to receive a first signal, wherein the circuit is configured to supply the first power supply voltage to the power input in response to the first signal being deasserted, and wherein the circuit is configured to supply a second power supply voltage to the power input in response to the first signal being asserted, and wherein the second power supply voltage is separate from the first signal, and wherein the circuit comprises a first transistor coupled between a second power supply line carrying the second power supply voltage and the power input, the first transistor having a gate terminal coupled to receive the first signal.

5. The apparatus as recited in claim 4 wherein the circuit further comprises a second transistor coupled between a first power supply line carrying the first power supply voltage and the power input, the second transistor having a gate terminal coupled to receive an inversion of the first signal.

6. The apparatus as recited in claim 5 wherein the first transistor is p-type and the second transistor is p-type.

7. An integrated circuit comprising:

a plurality of storage circuits, each storage circuit coupled to receive a first signal, wherein each storage circuit is configured to couple to a first power supply voltage for power in response to the first signal being deasserted, and wherein each storage circuit is configured to couple to a second power supply voltage for power in response to the first signal being asserted, wherein the first signal is the second power supply voltage, and wherein each storage circuit includes: (i) at least one memory cell having a power input, and (ii) a first transistor having both a first terminal and a gate terminal coupled to a first signal line carrying the first signal, and wherein the first transistor has a second terminal couple to the the power input.

8. The integrated circuit as recited in claim 7 further comprising logic circuitry coupled to the plurality of storage circuits and to receive the first power supply voltage.

9. The integrated circuit as recited in claim 7 further comprising one or more memory arrays.

10. The integrated circuit as recited in claim 9 wherein at least one of the memory arrays is coupled to receive the first signal, wherein the memory array is configured to couple to the first power supply voltage for power in response to the first signal being deasserted, and wherein the memory array is configured to couple to the second power supply voltage for power in response to the first signal being asserted.

11. The integrated circuit as recited in claim 9 wherein at least one of the memory arrays is powered only by the first power supply voltage.

12. The integrated circuit as recited in claim 7 further comprising a second plurality of storage circuits coupled only to receive the first power supply voltage.

13. The apparatus as recited in claim 4 wherein each of the first power supply voltage and the second power supply voltage are powered, during use, to voltages above a ground voltage.

* * * * *